(12) United States Patent
Liu et al.

(10) Patent No.: US 10,923,512 B2
(45) Date of Patent: Feb. 16, 2021

(54) ARRAY SUBSTRATE, PREPARATION METHOD THEREOF, AND DISPLAY DEVICE

(71) Applicant: BOE Technology Group Co., Ltd., Beijing (CN)

(72) Inventors: Qingzhao Liu, Beijing (CN); Jiushi Wang, Beijing (CN); Da Lu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/956,465

(22) Filed: Apr. 18, 2018

(65) Prior Publication Data

US 2019/0051677 A1 Feb. 14, 2019

(30) Foreign Application Priority Data

Aug. 9, 2017 (CN) .......................... 2017 1 0674709

(51) Int. Cl.
*H01L 27/12* (2006.01)
*H01L 29/40* (2006.01)
(Continued)

(52) U.S. Cl.
CPC .... *H01L 27/1259* (2013.01); *H01L 21/32155* (2013.01); *H01L 27/092* (2013.01);
(Continued)

(58) Field of Classification Search
None
See application file for complete search history.

(56) References Cited

U.S. PATENT DOCUMENTS 9,543,338 B2 * 1/2017 Liu ................... H01L 29/42384
2005/0009249 A1 1/2005 Oh et al.
(Continued)

FOREIGN PATENT DOCUMENTS

| CN | 1670930 A | 9/2005 |
| CN | 104241139 A | 12/2014 |

(Continued)

OTHER PUBLICATIONS

Balkrisnan et al. "Patterning PDMS using a combination of wet and dry etching", Mar. 26, 2009, IOP Publishing, Journal of Micromechanics and Microengineering, pp. 1-7/ (Year: 2009).*

(Continued)

*Primary Examiner* — Telly D Green

(74) *Attorney, Agent, or Firm* — McDermott Will & Emery LLP

(57) ABSTRACT

The embodiments of the present disclosure provide an array substrate, a preparation method thereof, and a display device. The preparation method of an array substrate comprises: forming the active layer, a gate insulating layer, the gate metal layer and the patterned photoresist sequentially on a substrate; forming a gate electrode transition pattern by etching a gate metal layer via a patterned photoresist, using a wet etching process and a dry etching process sequentially; and doping an area of the active layer not sheltered by the gate electrode transition pattern with ions to form a heavily doped area of the active layer.

13 Claims, 11 Drawing Sheets

(51) Int. Cl.
*H01L 21/3215* (2006.01)
*H01L 27/092* (2006.01)
*H01L 29/06* (2006.01)
*H01L 29/423* (2006.01)

(52) U.S. Cl.
CPC ...... *H01L 27/1288* (2013.01); *H01L 29/0615* (2013.01); *H01L 29/401* (2013.01); *H01L 29/4238* (2013.01)

(56) References Cited

U.S. PATENT DOCUMENTS

| | | | | |
|---|---|---|---|---|
| 2011/0273639 | A1* | 11/2011 | Xie | G02F 1/136286 349/43 |
| 2014/0070206 | A1* | 3/2014 | Dai | H01L 29/66969 257/43 |
| 2014/0147967 | A1* | 5/2014 | Park | H01L 29/66969 438/104 |
| 2014/0374718 | A1 | 12/2014 | Hsu et al. | |
| 2016/0254296 | A1* | 9/2016 | Liu | H01L 29/42384 438/158 |
| 2017/0317190 | A1 | 11/2017 | Xu et al. | |
| 2019/0019893 | A1* | 1/2019 | Shi | H01L 29/7869 |

FOREIGN PATENT DOCUMENTS

| | | |
|---|---|---|
| CN | 104241389 A | 12/2014 |
| CN | 104538455 A | 4/2015 |

OTHER PUBLICATIONS

Second Office Action in corresponding Chinese Patent Application No. 201710674709.3, dated Dec. 2, 2019 (Year: 2019).*

Office Action issued in corresponding Chinese Patent Application No. 201710674709.3, dated Jul. 24, 2019.

* cited by examiner

ARRAY SUBSTRATE, PREPARATION METHOD THEREOF, AND DISPLAY DEVICE

CROSS-REFERENCE TO RELATED APPLICATION

The present disclosure claims the benefit of Chinese Patent Application Disclosure No. 201710674709.3 filed on Aug. 9, 2017 in the State Intellectual Property Office of China, the whole disclosure of which is incorporated herein by reference.

TECHNICAL FIELD

The present disclosure relates to the technical field of display, and particularly to an array substrate, a preparation method thereof, and a display device.

BACKGROUND

A complementary metal oxide semiconductor (CMOS) is consisted of a positive channel metal oxide semiconductor (PMOS) and a negative channel metal oxide semiconductor (NMOS) collectively. As low temperature poly-silicon (LTPS) technology progressively becomes a manufacture technology of a new generation thin film transistor (TFT), currently, it is usual to use the LTPS technology to prepare active layer patterns of a PMOS area and an NMOS area in a CMOS circuit respectively.

In relevant LTPS CMOS preparation processes, it is required to doping the active layer to form a heavily doped (source/drain doping, SD doping) area and a lightly doped (light doped drain, LDD doping) area, in order to prevent hot carrier effect.

SUMMARY

An embodiment of the present disclosure provides a preparation method of an array substrate, the preparation method comprising: forming the active layer, a gate insulating layer, the gate metal layer and the patterned photoresist sequentially on a substrate; forming a gate electrode transition pattern by etching a gate metal layer via a patterned photoresist, using a wet etching process and a dry etching process sequentially; and doping an area of the active layer not sheltered by the gate electrode transition pattern with ions to form a heavily doped area of the active layer.

According to another aspect of the present disclosure, said heavily doped area of the active layer is a source/drain doped area of the active layer.

According to another aspect of the present disclosure, said forming the gate electrode transition pattern comprises: etching the gate metal layer by using the wet etching process, to form an etched portion of the gate metal layer in which 80% to 90% of a thickness of the gate metal layer is removed, and a non-etched portion of the gate metal layer beneath photoresist pattern, wherein a width of the photoresist pattern is larger than a width of the non-etched portion of the gate metal layer; and further etching the gate metal layer by using the dry etching process, to remove the etched portion of the gate metal layer and a portion of the photoresist pattern beyond the width of non-etched portion of the gate metal layer, thereby forming the gate electrode transition pattern, wherein, a width of the gate electrode transition pattern and a width of the photoresist pattern in a plane of contact surface therebetween are substantially the same.

According to another aspect of the present disclosure, after forming the heavily doped area of the active layer, the method further comprises: etching the gate electrode transition pattern to form a gate electrode.

According to another aspect of the present disclosure, said etching the gate electrode transition pattern to form the gate electrode comprises: subjecting the gate electrode transition pattern to a wet etching process and a dry etching process sequentially to form the gate electrode.

According to another aspect of the present disclosure, said etching the gate electrode transition pattern to form the gate electrode comprises: subjecting the gate electrode transition pattern to a dry etching process to form the gate electrode.

According to another aspect of the present disclosure, said etching the gate electrode transition pattern to form the gate electrode comprises: subjecting the gate electrode transition pattern to a wet etching process to form the gate electrode, and then optionally stripping the photoresist off.

According to another aspect of the present disclosure, after forming the gate electrode, the method further comprises: doping an area of the active layer not sheltered by the gate electrode with ions to form a lightly doped area of the active layer.

According to another aspect of the present disclosure, the array substrate is an LTPS thin film transistor array substrate.

According to another aspect of the present disclosure, for the LTPS thin film transistor array substrate, said forming the active layer, the gate insulating layer, the gate metal layer and the patterned photoresist sequentially on a substrate comprises: forming the active layer on the substrate; depositing the gate insulating layer and the gate metal layer sequentially on the substrate with a pattern of the active layer formed thereon; and applying a layer of photoresist on the gate metal layer, exposing and developing the photoresist to form the patterned photoresist, an orthographic projection of the patterned photoresist on the substrate covering an orthographic projection of the active layer on the substrate.

According to another aspect of the present disclosure, the array substrate is a low temperature poly-silicon complementary metal oxide semiconductor (LTPS CMOS) circuit array substrate.

According to another aspect of the present disclosure, for the LTPS CMOS circuit array substrate, said forming the active layer, the gate insulating layer, the gate metal layer and the patterned photoresist sequentially on a substrate comprises: forming an NMOS active layer and a PMOS active layer on the substrate; depositing the gate insulating layer and the gate metal layer sequentially on the substrate with a pattern of the NMOS active layer and the PMOS active layer formed thereon; forming a PMOS gate electrode and a source/drain doped area of the PMOS active layer; and applying a layer of photoresist, exposing and developing the photoresist to form an NMOS patterned photoresist and a PMOS patterned photoresist, orthographic projections of the NMOS patterned photoresist and the PMOS patterned photoresist on the substrate covering orthographic projections of the NMOS active layer and the PMOS active layer on the substrate respectively.

According to another aspect of the present disclosure, said forming the PMOS gate electrode and the source/drain doped area of the PMOS active layer comprises: forming the PMOS gate electrode and an NMOS gate metal layer pattern through a patterning process, an orthographic projection of the NMOS gate metal layer pattern on the substrate covering an orthographic projection of the NMOS active layer on the substrate; and doping an area of the PMOS active layer not sheltered by the PMOS gate electrode with ions to form the source/drain doped area of the PMOS active layer.

According to another aspect of the present disclosure, the LTPS CMOS circuit array substrate comprises an NMOS area and a PMOS area, and said forming the active layer, the gate insulating layer, the gate metal layer and the patterned photoresist sequentially on the substrate comprises: forming an NMOS active layer and a PMOS active layer on the substrate; depositing the gate insulating layer and the gate metal layer sequentially on the substrate with a pattern of the NMOS active layer and the PMOS active layer formed thereon; and applying a layer of photoresist on the gate metal layer, exposing and developing the photoresist to form an NMOS patterned photoresist and a PMOS patterned photoresist, an orthographic projection of the NMOS patterned photoresist on the substrate being completely overlapped with an orthographic projection of the NMOS active layer on the substrate, and a width of the PMOS patterned photoresist being the same as a width of the PMOS area, such that an orthographic projection of the PMOS patterned photoresist on the substrate covering an orthographic projection of the PMOS active layer on the substrate.

According to another aspect of the present disclosure, after forming the gate electrode and the lightly doped area of the active layer in the NMOS area, the preparation method further comprises: forming a PMOS gate electrode and a source/drain doped area of the PMOS active layer.

According to another aspect of the present disclosure, said forming the PMOS gate electrode and the source/drain doped area of the PMOS active layer comprises: applying a layer of photoresist, exposing and developing the photoresist to form an NMOS patterned photoresist and a PMOS patterned photoresist, an orthographic projection of the NMOS patterned photoresist on the substrate covering an orthographic projection of the NMOS active layer on the substrate; etching the gate metal layer in the PMOS area by a wet etching process, to form an etched portion of the gate metal layer in which 80% to 90% of a thickness of the gate metal layer is removed, and a non-etched portion of the gate metal layer beneath photoresist pattern, wherein a width of the photoresist pattern is larger than a width of the non-etched portion of the gate metal layer; then etching the gate metal layer by a dry etching process, to remove the etched portion of the gate metal layer and a portion of the photoresist pattern beyond the width of non-etched portion of the gate metal layer, thereby forming the PMOS gate electrode, wherein, a width of the PMOS gate electrode and a width of the photoresist pattern in a plane of contact surface therebetween are substantially the same; and doping an area of the PMOS active layer not sheltered by the PMOS gate electrode with ions to form the source/drain doped area of the PMOS active layer.

According to another aspect of the present disclosure, after forming the lightly doped area of the active layer, the preparation method further comprises: stripping the remaining photoresist off; forming an interlayer dielectric layer; and forming source/drain electrodes on the interlayer dielectric layer, the source/drain electrodes being connected with the heavily doped area of the active layer through via holes.

An embodiment of the present disclosure further provides an array substrate prepared by the aforementioned preparation method.

An embodiment of the present disclosure further provides a display device comprising the aforementioned array substrate.

It is understood that other embodiments and configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The drawings are used to provide a further understanding of the technical solutions of the present disclosure, and form a part of the description. The drawings together with the embodiments of the present disclosure are used to explain, but not to limit the technical solutions of the present invention. The shape and size of each component in the drawings do not indicate the actual scale, but are only schematic illustration.

DETAILED DESCRIPTION

Some specific implementations of the present disclosure are described in detail below with reference to the drawings and embodiments. The following embodiments are intended to illustrate the present disclosure, but not to limit the scope of the present disclosure. It should be noted that, unless contradiction, the embodiments of the present disclosure and the features in the embodiments can be combined with each other arbitrarily.

After research, the inventors find that there is a relatively large doped area deviation in relevant preparation processes, which results in inaccurate lengths of heavily doped area and lightly doped area, leading to poor electrical properties of an LTPS thin film transistor, and directly influencing the reliability and yield rate of the product.

After further research, the inventors find that the relatively large doped area deviation in relevant preparation processes is caused by the process mode employed. In the relevant processes, the treatment procedure of forming a doped area generally comprises: forming a gate electrode pattern by performing a wet etching process at one time, wherein a width of photoresist (PR) pattern after wet etching is larger than that of the gate electrode pattern, because photoresist loss in wet etching is small; after that, performing a doping treatment by using the PR as a shelter to form a heavily doped area; and finally ashing the PR and performing a doping treatment for a lightly doped area. Since the blocking capacity of the photoresist is limited, and two sides of the photoresist on the gate electrode become thinner such that the blocking capacity is further reduced, ions can easily enter into the lightly doped area when performing a doping treatment for the heavily doped area, resulting in a large doped area deviation, thereby making the lengths of the heavily doped area and the lightly doped area inaccurate. In order to solve the problem of doped area deviation, a solution in which the gate electrode pattern is formed by performing a dry etching process at one time is proposed. However, such dry etching not only causes large photoresist loss, but also causes damage to the gate insulating layer, as a result, there is still the problem of doped area deviation, and an instance of influencing the active layer channel below the gate electrode may even occur.

Figure 1:
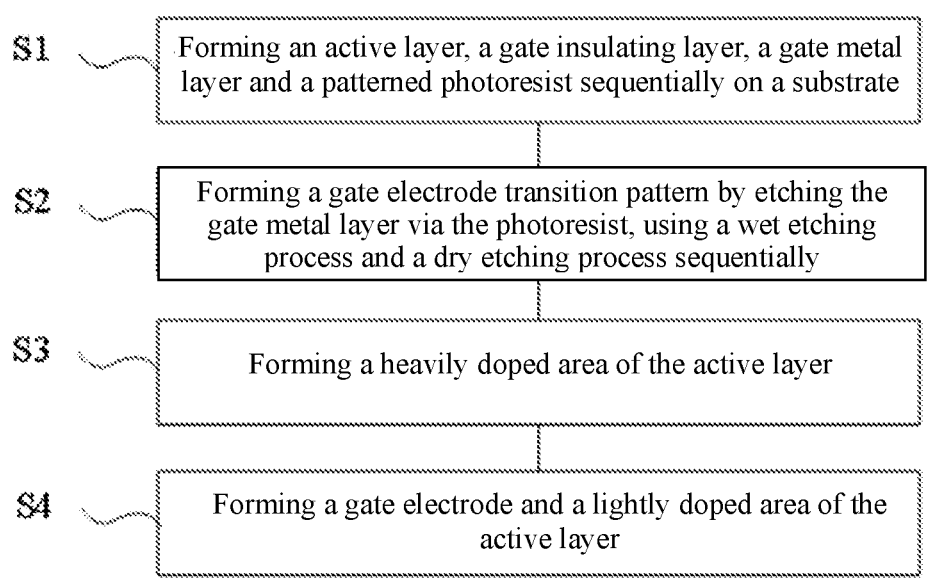
FIG. 1 is a flow chart of a preparation method of an array substrate according to an embodiment of the present disclosure.

To address the problem of relatively large doped area deviation in the relevant preparation processes, embodiments of the present disclosure provide a preparation method of an array substrate. FIG. 1 is one representative flow chart of a preparation method of an array substrate according to the embodiments of the present disclosure. As shown in FIG. 1, the preparation method of an array substrate comprises: S1: forming an active layer, a gate insulating layer, a gate metal layer and a patterned photoresist sequentially on a substrate; S2: forming a gate electrode transition pattern by etching the gate metal layer via the photoresist, using a wet etching process and a dry etching process sequentially; S3: forming a heavily doped area of the active layer; and S4: forming a gate electrode and a lightly doped area of the active layer.

Here, step S2 may comprise: S21: etching the gate metal layer by a wet etching process, to form an etched portion of the gate metal layer in which 80% to 90% of a thickness of the gate metal layer is removed, and a non-etched portion of the gate metal layer beneath photoresist pattern, wherein a width of the photoresist pattern is larger than a width of the non-etched portion of the gate metal layer; and S22: further etching the gate metal layer by a dry etching process, to remove the etched portion of the gate metal layer and a portion of the photoresist pattern beyond the width of non-etched portion of the gate metal layer, thereby forming a gate electrode transition pattern, wherein, a width of the gate electrode transition pattern and a width of the photoresist pattern in a plane of contact surface therebetween are substantially the same.

Here, step S3 may comprise: doping an area of the active layer not sheltered by the gate electrode transition pattern with ions to form the heavily doped area of the active layer.

In one particular embodiment, step S4 may comprise: subjecting the gate electrode transition pattern to a wet etching process and a dry etching process to form the gate electrode; and doping an area of the active layer not sheltered by the gate electrode with ions to form a lightly doped area.

In another particular embodiment, step S4 may comprise: subjecting the gate electrode transition pattern to a dry etching process to form the gate electrode; and doping an area of the active layer not sheltered by the gate electrode with ions to form the lightly doped area.

In yet another particular embodiment, step S4 may comprise: subjecting the gate electrode transition pattern to a wet etching process to form the gate electrode; then stripping the photoresist off; and doping an area of the active layer not sheltered by the gate electrode with ions to form the lightly doped area.

For an LTPS thin film transistor array substrate, step S1 comprises: S101: forming an active layer on a substrate; S102: depositing a gate insulating layer and a gate metal layer sequentially on the substrate with a pattern of the active layer formed thereon; and S103: applying a layer of photoresist on the gate metal layer, exposing and developing the photoresist to form a patterned photoresist, an orthographic projection of the patterned photoresist on the substrate covering an orthographic projection of the active layer on the substrate.

For an LTPS CMOS circuit array substrate, in one embodiment, step S1 comprises: S111: forming an NMOS active layer and a PMOS active layer on a substrate; S112: depositing a gate insulating layer and a gate metal layer sequentially on the substrate with a pattern of the NMOS active layer and the PMOS active layer formed thereon; S113: forming a PMOS gate electrode and a source/drain doped area of the PMOS active layer; and S114: applying a layer of photoresist, exposing and developing the photoresist to form an NMOS patterned photoresist and a PMOS patterned photoresist, orthographic projections of the NMOS patterned photoresist and the PMOS patterned photoresist on the substrate covering orthographic projections of the NMOS active layer and the PMOS active layer on the substrate respectively.

Here, step S113 may comprise: forming a PMOS gate electrode and a pattern of NMOS gate metal layer by a patterning process, an orthographic projection of the NMOS gate metal layer on the substrate covering an orthographic projection of the NMOS active layer on the substrate; and doping an area of the PMOS active layer not sheltered by the PMOS gate electrode with ions to form a source/drain doped area of the PMOS active layer.

For an LTPS CMOS circuit array substrate comprising an NMOS area and a PMOS area, in another embodiment, step S1 comprises: S121: forming an NMOS active layer and a PMOS active layer on a substrate; S122: depositing a gate insulating layer and a gate metal layer sequentially on the substrate with a pattern of the NMOS active layer and the PMOS active layer formed thereon; and S123: applying a layer of photoresist on the gate metal layer, exposing and developing the photoresist to form an NMOS patterned photoresist and a PMOS patterned photoresist, orthographic projections of the NMOS patterned photoresist and the PMOS patterned photoresist on the substrate covering orthographic projections of the NMOS active layer and the PMOS active layer on the substrate respectively.

In one particular embodiment, in step S123, the orthographic projection of the NMOS patterned photoresist on the substrate is completely overlapped with the orthographic projection of the NMOS active layer on the substrate, and a width of the PMOS patterned photoresist is the same as a width of PMOS area, such that the orthographic projection of the PMOS patterned photoresist on the substrate covers the orthographic projection of the PMOS active layer on the substrate; and after step S4, the preparation method further comprises: S5: forming a PMOS gate electrode and a source/drain doped area of the PMOS active layer.

Here, step S5 may comprise: applying a layer of photoresist on the substrate after step S4, exposing and developing the photoresist to form an NMOS patterned photoresist and a PMOS patterned photoresist, an orthographic projection of the NMOS patterned photoresist on the substrate covering an orthographic projection of the NMOS active layer on the substrate; subjecting the PMOS gate metal layer to a dry etching process to form a PMOS gate electrode pattern; and doping an area of the PMOS active layer not sheltered by the PMOS gate electrode with ions to form a source/drain doped area of the PMOS active layer.

Alternatively, step S5 may comprise: applying a layer of photoresist, exposing and developing the photoresist to form an NMOS patterned photoresist and a PMOS patterned photoresist, an orthographic projection of the NMOS patterned photoresist on the substrate covering an orthographic projection of the NMOS active layer on the substrate; etching the PMOS gate metal layer by a wet etching process, to form an etched portion of the gate metal layer in which 80% to 90% of a thickness of the gate metal layer is removed, and a non-etched portion of the gate metal layer beneath photoresist pattern, wherein a width of the photoresist pattern is larger than a width of the non-etched portion of the gate metal layer; then etching the gate metal layer by a dry etching process, to remove the etched portion of the gate metal layer and a portion of the photoresist pattern beyond the width of non-etched portion of the gate metal layer, thereby forming a PMOS gate electrode, wherein, a width of the PMOS gate electrode and a width of the photoresist pattern in a plane of contact surface therebetween are substantially the same; and doping an area of the PMOS active layer not sheltered by the PMOS gate electrode with ions to form a source/drain doped area of the PMOS active layer.

The preparation method of an array substrate provided in the embodiments of the present disclosure not only overcomes the problem of critical dimension deviation caused by large over etching requirement in relevant processes merely using wet etching, but also overcomes the problem that the subsequent doping is influenced due to large photoresist loss in relevant processes merely using dry etching, by using a combined process of "wet etching+dry etching" to form a gate electrode transition pattern, and using the gate electrode transition pattern as a shelter to ensure the length of the heavily doped area Further, by using a combined process of "wet etching+dry etching" before forming the lightly doped area, not only the etching time is shortened, but also the thickness of the photoresist on the gate electrode are ensured, thereby ensuring the length of the lightly doped area. The embodiments of the present disclosure effectively overcome the problem of relatively large doped area deviation in relevant preparation processes, ensure the lengths of the heavily doped area and the lightly doped area, and thus improve the electrical properties of the LTPS thin film transistor, and increase the reliability and yield rate of the product.

Of course, any product or method of the present disclosure is not necessarily required to achieve all above-mentioned advantages at the same time. Other features and advantages of the present disclosure will be illustrated in the following embodiments of the description, and become apparent from the embodiments of the description, or are appreciated by implementing the present disclosure. The objects and other advantages of the present disclosure can be achieved and obtained by the structures specified in the description, the claims and the drawings.

The technical solutions of the embodiments of the present disclosure will be further described below through the preparation process of an array substrate. Here, the "patterning process" as described in the embodiment includes treatments such as depositing a film layer, applying a photoresist, exposing with a mask, developing, etching, stripping photoresist off and the like, and is a mature preparation process. The depositing may utilize known processes such as sputtering, evaporation, chemical vapor deposition and the like, the applying may utilize known coating processes, and the etching may utilize known methods, which are not particularly limited here.

FIGS. 2 to 12 are schematic diagrams of one embodiment of the preparation method of an array substrate according to the present disclosure.

Figure 2:
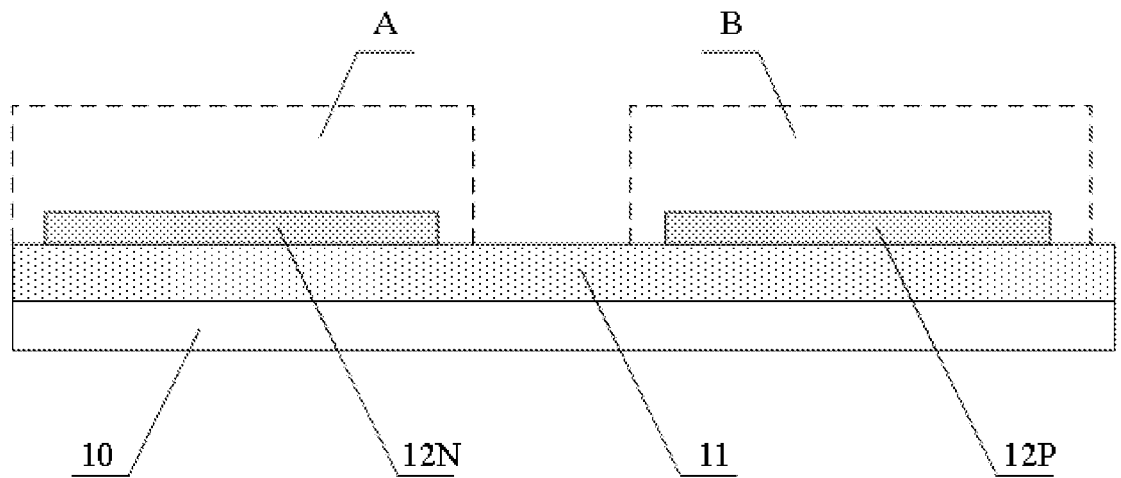
FIG. 2 is a schematic diagram of one embodiment of the present disclosure after forming a buffer layer, an NMOS active layer pattern and a PMOS active layer pattern.

In a first patterning process, a buffer layer and a pattern of NMOS active layer and PMOS active layer are formed on a substrate. Forming the buffer layer and the pattern of NMOS active layer and PMOS active layer comprises: depositing a buffer layer 11 and an active layer thin film sequentially on the substrate 10; applying a layer of photoresist (PR) on the active layer thin film, exposing and developing the photoresist with a monochromatic mask, to form an unexposed area with the photoresist retained at a position of a pattern of NMOS active layer and PMOS active layer, and to form a fully exposed area without photoresist at other position so as to expose the active layer thin film; etching the active layer thin film in the fully exposed area and stripping the remaining photoresist to form an NMOS active layer 12N and a PMOS active layer 12P on the buffer layer 11, the buffer layer 11 covering the entire substrate 10, the NMON active layer 12N being formed in an NMOS area A, and the PMOS active layer 12P being formed in the PMOS area B, as shown in FIG. 2. Here, the substrate 10 may be a glass substrate or a quartz substrate, the buffer layer 11 is used for blocking the influence of ions in the substrate on the thin film transistor, and may be silicon nitride (SiNx), silicon oxide (SiOx) or a composite thin film of SiNx/SiOx. The active layer thin film may be an amorphous silicon (a-Si)

material, which will be subjected to processes such as crystallization or laser annealing to form a poly-silicon material.

Figure 3:
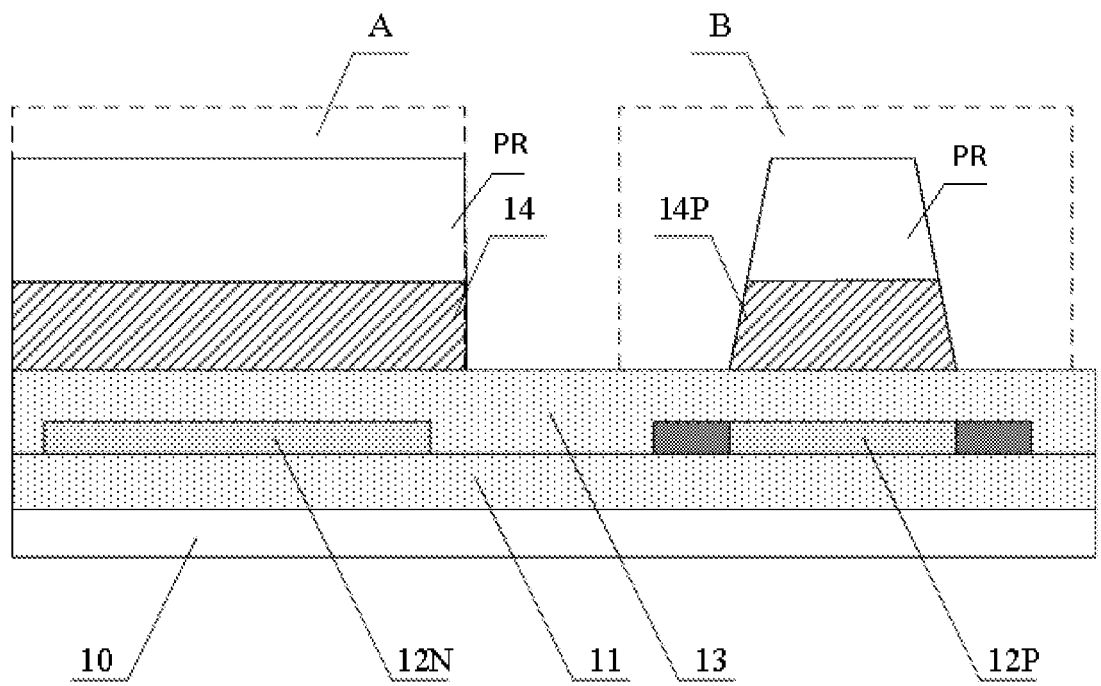
FIG. 3 is a schematic diagram of one embodiment of the present disclosure after forming a PMOS gate electrode and a source/drain doped area.

In a second patterning process, a PMOS gate electrode, an NMOS gate electrode pattern and a doped area are formed respectively. Forming the PMOS gate electrode, the NMOS gate electrode pattern and the doped area respectively comprises: (1) Depositing a gate insulating layer 13 and a gate metal layer sequentially on the substrate with the aforementioned pattern formed thereon (after the first patterning process); applying a layer of photoresist (PR) on the gate metal layer, exposing and developing the photoresist with a monochromatic mask, to form an unexposed area with the photoresist retained at a position of the NMOS area A and a position of a PMOS gate electrode pattern, and to form a fully exposed area without photoresist at other position so as to expose the gate metal layer; etching the gate metal layer in the fully exposed area to form a pattern of PMOS gate electrode 14P and a pattern of NMOS gate metal layer 14 on the gate insulating layer 13, where, an orthographic projection of the PMOS gate electrode 14P on the substrate 10 is within an orthographic projection of the PMOS active layer 12P on the substrate 10, that is, a width of the orthographic projection of the PMOS gate electrode 14P on the substrate 10 is less a width of the orthographic projection of the PMOS active layer 12P on the substrate 10; a width of the NMOS gate metal layer 14 is the same as a width of the NMOS area A, and an orthographic projection of the NMOS gate metal layer 14 on the substrate 10 covers an orthographic projection of the NMOS active layer 12N on the substrate 10; and subsequently, doping an area of the PMOS active layer 12P not sheltered by the PMOS gate electrode 14P with ions to form a source/drain doped area, as shown in FIG. 3. In practical implementation, one or more selected from metals of platinum (Pt), ruthenium (Ru), gold (Au), silver (Ag), molybdenum (Mo), chromium (Cr), aluminum (Al), tantalum (Ta), titanium (Ti), tungsten (W), and the like may be utilized as the gate metal layer, and a dry or wet etching process may be utilized as the etching process to form the PMOS gate electrode pattern and the NMOS gate metal layer pattern.

Figure 4:
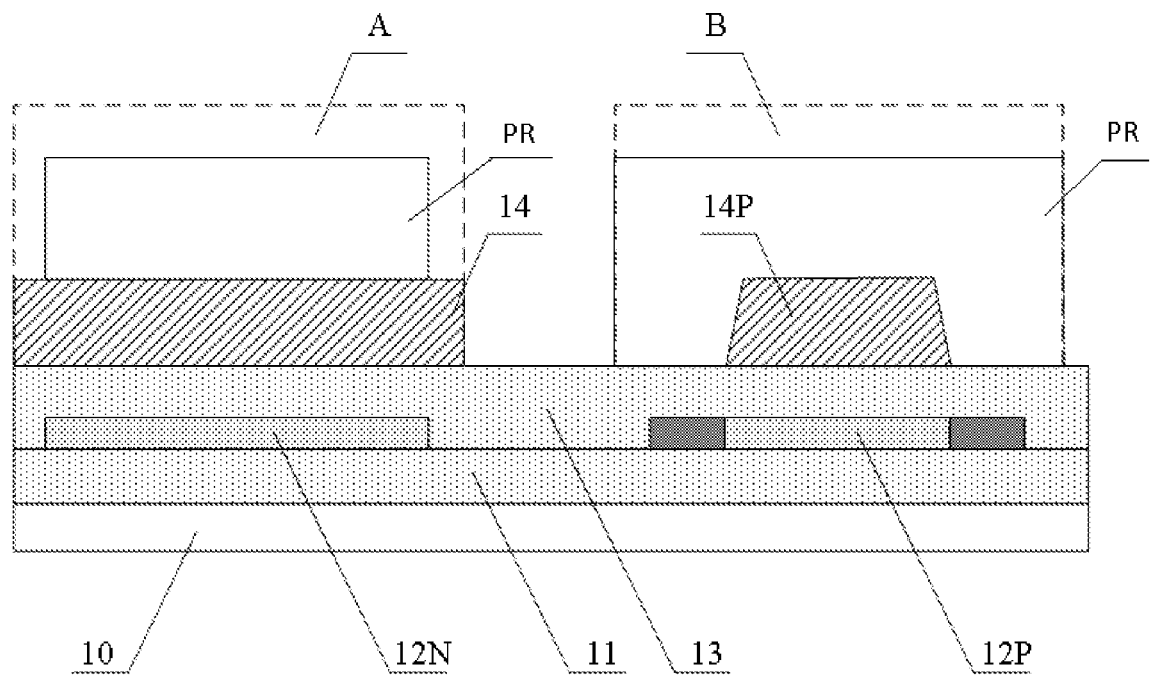
FIG. 4 is a schematic diagram of one embodiment of the present disclosure after forming a patterned photoresist.

(2) Applying a layer of photoresist (PR) on the substrate with the aforementioned pattern formed thereon (after the step (1)), exposing and developing the photoresist with a monochromatic mask, to form an unexposed area with the photoresist retained, including an NMOS patterned photoresist and a PMOS patterned photoresist, and to form a fully exposed area without photoresist at other position. Here, an orthographic projection of the NMOS patterned photoresist on the substrate is completely overlapped with an orthographic projection of the NMOS active layer 12N on the substrate, that is, a width of the orthographic projection of the NMOS patterned photoresist on the substrate 10 is right equal to a width of the orthographic projection of the NMOS active layer 12N on the substrate 10. A width of the PMOS patterned photoresist is the same as that of the PMOS area B, such that an orthographic projection of the PMOS patterned photoresist on the substrate 10 covers an orthographic projection of the PMOS active layer 12P on the substrate 10, that is, a width of the orthographic projection of the PMOS patterned photoresist on the substrate 10 is larger than a width of the orthographic projection of the PMOS active layer 12P on the substrate 10, as shown in FIG. 4.

Figure 5:
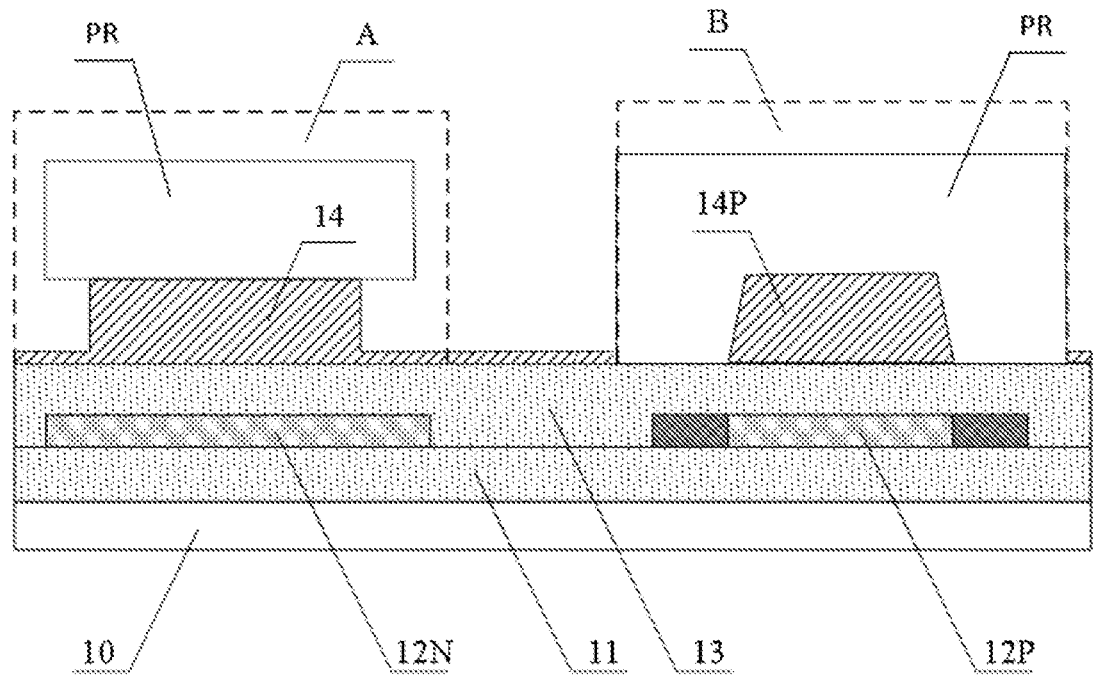
FIG. 5 is a schematic diagram of one embodiment of the present disclosure after wet etching during the formation of an NMOS gate electrode.

(3) Etching the exposed NMOS gate metal layer 14 in the NMOS area A by a wet etching process to remove about 80% to 90% of a thickness of the NMOS gate metal layer 14, as shown in FIG. 5. Because the wet etching process does not cause photoresist loss, change in the photoresist pattern after the completion of this process is relatively small, and two sides of the NMOS gate metal layer 14 are over etched.

Figure 6:
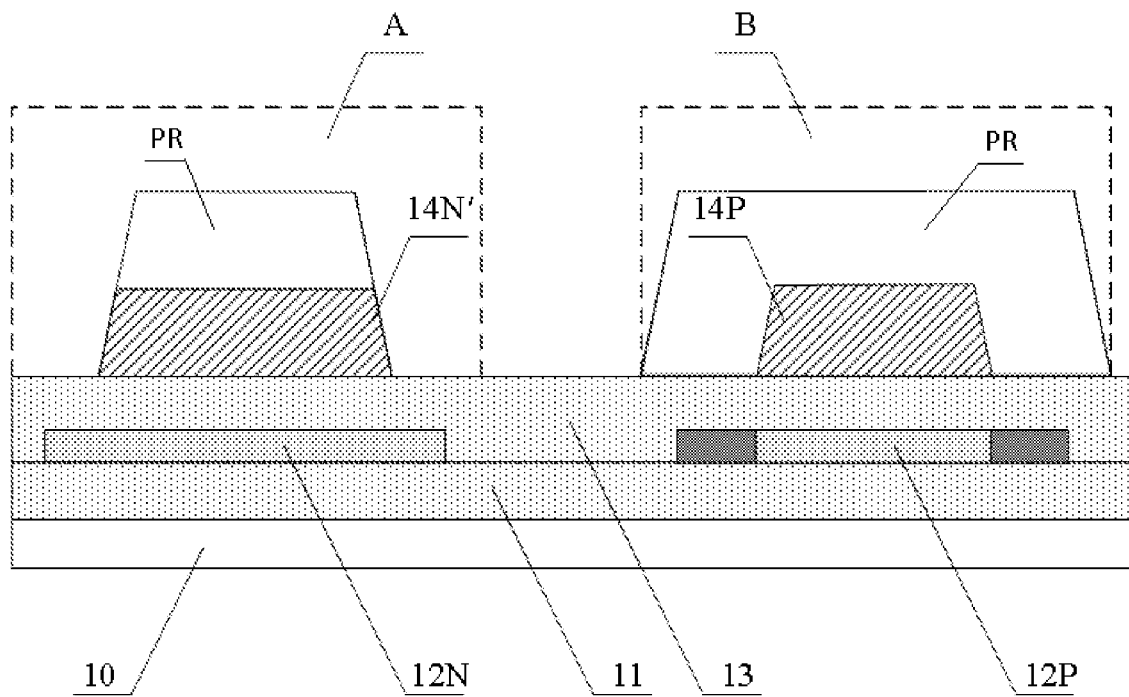
FIG. 6 is a schematic diagram of one embodiment of the present disclosure after dry etching during the formation of the NMOS gate electrode.

(4) Then etching the NMOS gate metal layer 14 by a dry etching process, and obtaining an etching endpoint with an electrophoretic display (EPD) technology, to form an NMOS gate electrode transition pattern 14N', as shown in FIG. 6. Since the dry etching process causes photoresist loss, the morphology of the photoresist pattern will be changed while etching the NMOS gate metal layer 14, and after the completion of etching, the width and thickness of the photoresist pattern are both reduced, such that a width of the NMOS gate electrode transition pattern 14N' and a width of the photoresist pattern in a plane of contact surface therebetween are substantially the same.

To address the problem that there is a large critical dimension deviation due to over etching when etching NMOS gate electrode pattern merely by a wet etching process, the embodiment of the present application adopts a combined process of "wet etching+dry etching" to form an NMOS gate electrode transition pattern which is used as a blocking layer in subsequent doping, making use of the characteristics of rapid etching rate and no photoresist loss in wet etching process and high accuracy in dry etching process, so as to not only overcomes the problem of critical dimension deviation due to large over etching requirement in the relevant art, but also overcomes the problem that the subsequent doping is influenced due to large photoresist loss when merely using dry etching, and the NMOS gate electrode transition pattern is used as a blocking layer in subsequent doping. Although a dry etching process which causes photoresist loss is also used, the photoresist loss in this embodiment is relatively small due to a short dry etching time.

Figure 7:
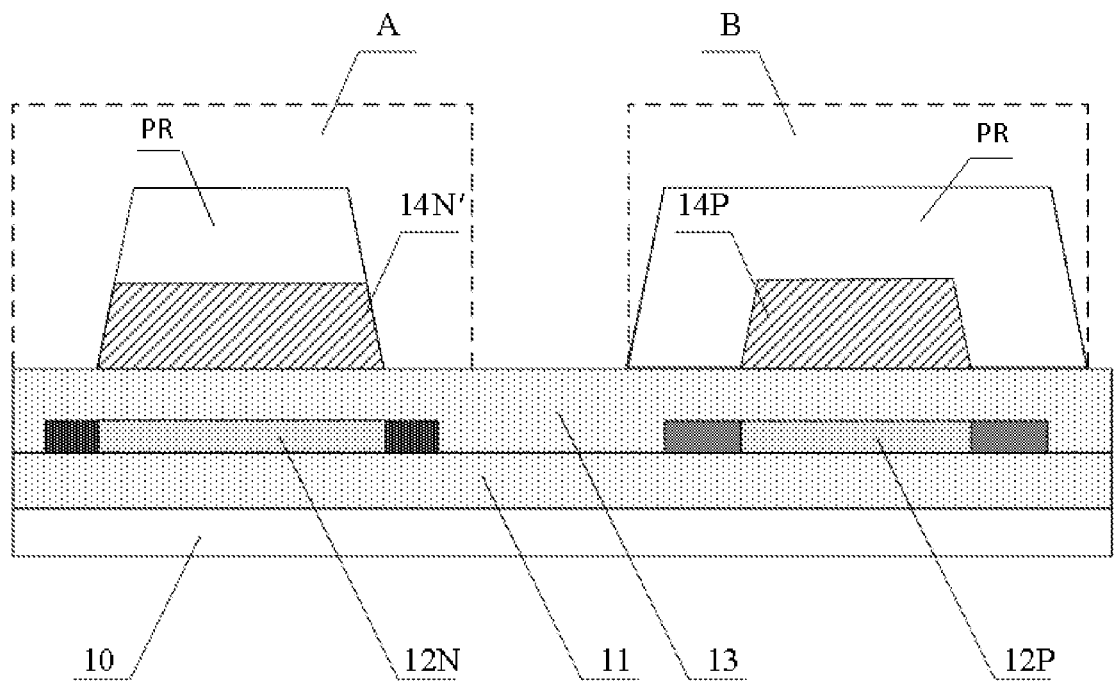
FIG. 7 is a schematic diagram of one embodiment of the present disclosure after forming a heavily doped area.

(5) Subsequently, performing a heavy doping process to dope an area of the NMOS active layer 12N not sheltered by the NMOS gate electrode transition pattern 14N' with ions, to form a heavily doped area, as shown in FIG. 7. Actually, because most area of the NMOS active layer 12N is doubly blocked by both the NMOS gate electrode transition pattern 14N' and the photoresist thereon, the influence of doping ions on other area of the NMOS active layer is insulated to the greatest extent, avoiding the doped area deviation and ensuring the length range of the heavily doped area. In comparison with relevant art in which only a single photoresist layer is used as a shelter when performing source/drain doping, this embodiment enhances the blocking effect to the greatest extent, due to the facts that not only the NMOS gate electrode transition pattern is used for blocking, but also most area is doubly blocked.

Figure 8:
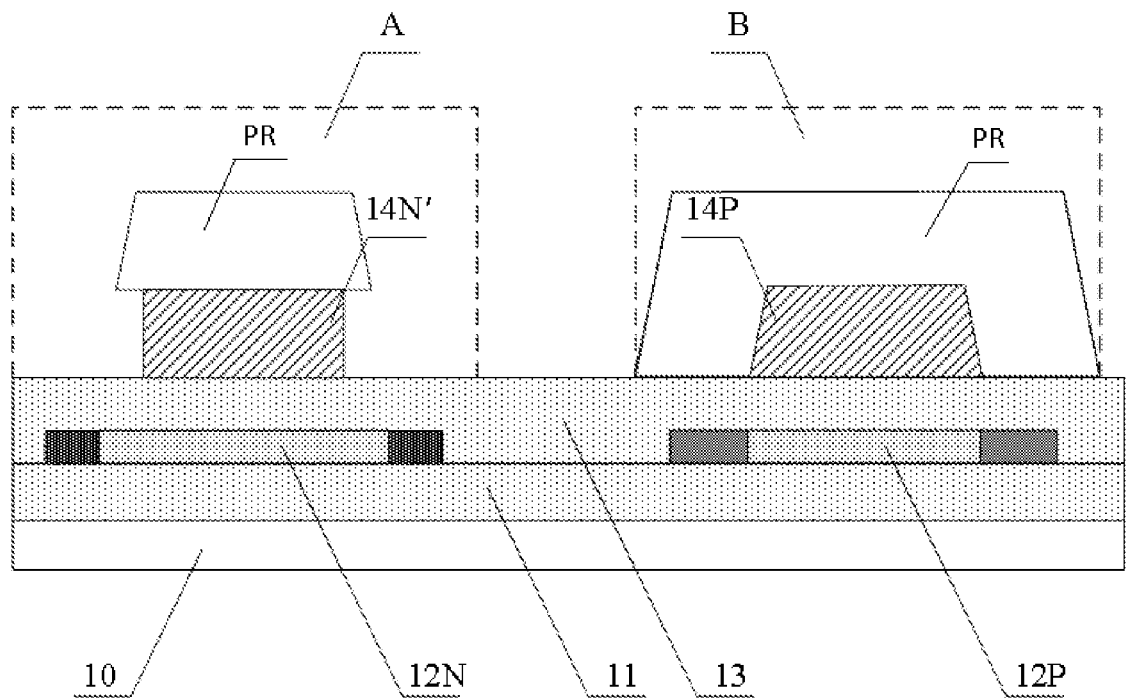
FIG. 8 is a schematic diagram of one embodiment of the present disclosure before lightly doping and after wet etching.
Figure 9:
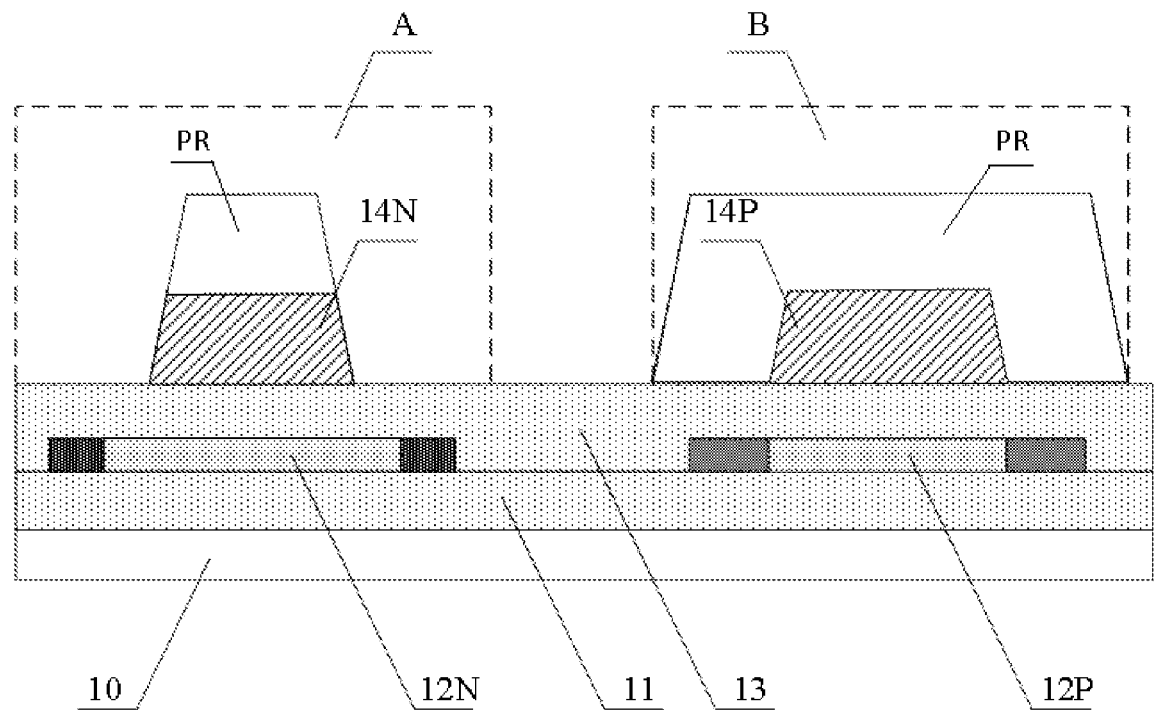
FIG. 9 is a schematic diagram of one embodiment of the present disclosure before lightly doping and after dry etching.

(6) Subsequently, etching the NMOS gate electrode transition pattern 14N' by a wet etching process to expose a lightly doped area, as shown in FIG. 8. Generally, a length of the lightly doped area (LLD) is about 1 µm. By using a wet etching process in this stage, it may achieve a relatively large etching amount while not causing loss in photoresist (7) Subsequently, subjecting the NMOS gate electrode transition pattern 14N' to a dry etching treatment to form a NMOS gate electrode 14N, as shown in FIG. 9. If dry etching is performed immediately after forming the heavily doped area, a width of the photoresist after dry etching will less than that of the NMOS gate electrode 14N (because dry etching will cause a photoresist loss), and it may cause damage to the gate insulating layer 13, such that subsequent light doping will influence the channel area of the NMOS active layer 12N, resulting in a doped area deviation. In this embodiment, by using a combined process of "wet etching+ dry etching" after forming the heavily doped area, making use of relatively large etching amount but small photoresist loss in wet etching and the characteristic that a transverse loss rate of the photoresist is larger than a vertical loss rate in dry etching, it can be ensured that a width of the NMOS gate electrode is substantially equal to that of the photoresist contact surface, such that the photoresist can also function as an effective shelter during subsequent light doping, so the length of the lightly doped area (LDD) can be ensured and no doped area deviation will occur. Generally, it is required that the width of the photoresist on the NMOS gate electrode is larger than 1 µm when performing light doping, such that it can be ensured that the NMOS active layer below the NMOS gate electrode will not influenced by light doping. This embodiment can ensure that the width of the photoresist on the NMOS gate electrode 14N is larger than 1 µm, taking advantage of the characteristic of small photoresist loss in the combined process of "wet etching+dry etching". Meanwhile, the combined process of "wet etching+dry etching" in this embodiment shortens the etching time greatly, and reduces the damage to the gate insulating layer during dry etching, thereby further ensuring the length of the lightly doped area (LDD).

Figure 10:
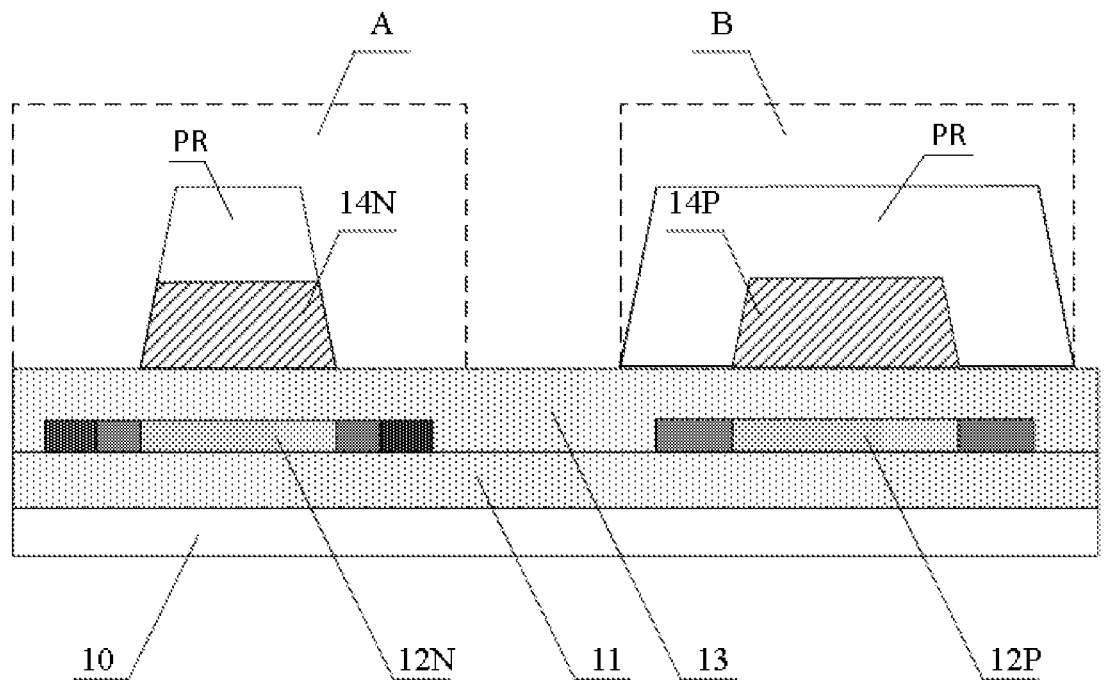
FIG. 10 is a schematic diagram of one embodiment of the present disclosure after forming a lightly doped area.

(8) Subsequently, performing light doping to dope an area of the NMOS active layer 12N not sheltered by the NMOS gate electrode 14N with ions, so as to form a lightly doped area, as shown in FIG. 10. Actually, because most area of the NMOS active layer is doubly blocked by both the NMOS gate metal layer 14 and the photoresist thereon, the influence of doping ions on the channel area of the NMOS active layer is insulated to the greatest extent, avoiding the doped area deviation and ensuring the length range of the lightly doped area.

Figure 11:
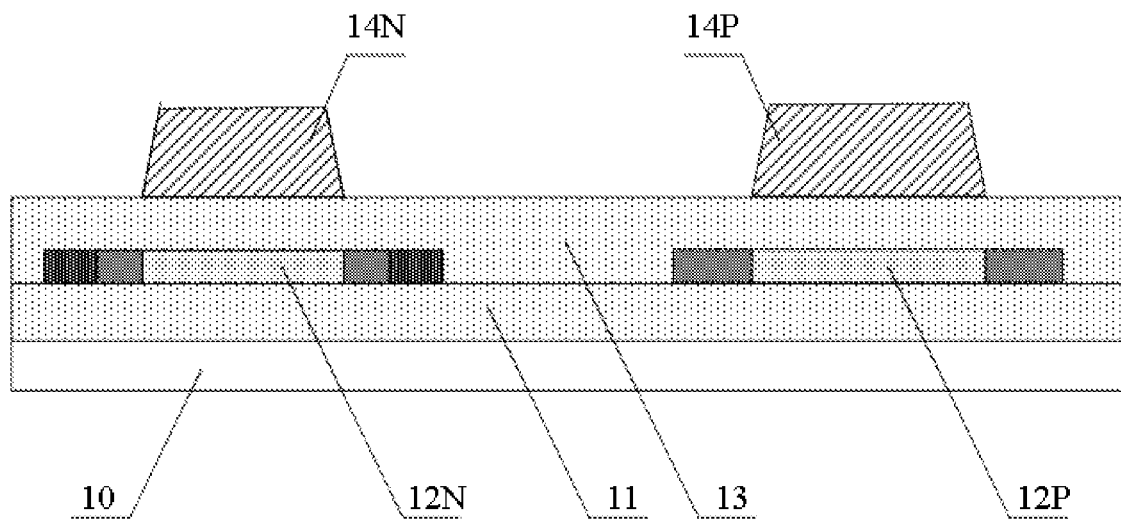
FIG. 11 is a schematic diagram of one embodiment of the present disclosure after stripping the remaining photoresist off.

(9) And finally, stripping the remaining photoresist to form a pattern of the PMOS gate electrode, the NMOS gate electrode and the doped areas, as shown in FIG. 11.

In this embodiment, in the source/drain doping and the light doping, since the PMOS area B is covered with the photoresist and the photoresist loss is small, the doping treatment of the NMOS active layer does not influence the PMOS active layer.

Figure 12:
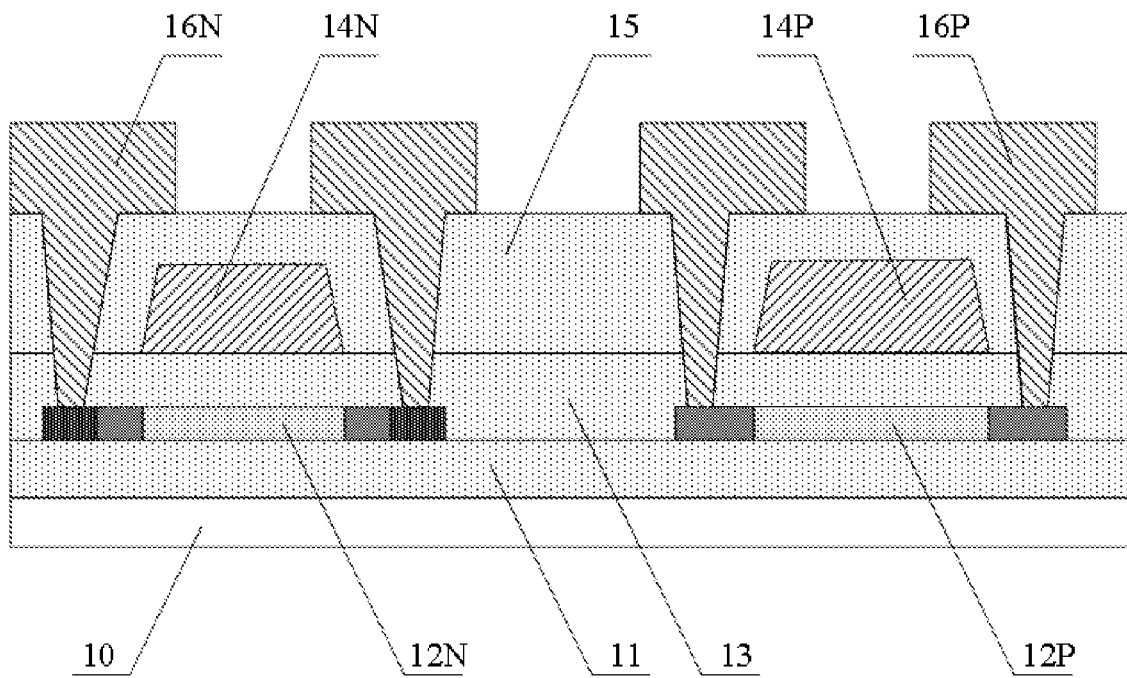
FIG. 12 is a schematic diagram of one embodiment of the present disclosure after forming NMOS and PMOS source/drain electrodes.

In practical implementation, this embodiment may further comprise: depositing an interlayer dielectric layer 15 on the substrate with the aforementioned pattern formed thereon (after step (9)), forming via holes penetrating the interlayer dielectric layer 15 and the gate insulating layer 13 by a patterning process, with the doped areas of the NMOS active layer 12N and the PMOS active layer 12P being exposed in the via holes. On the substrate with the aforementioned pattern formed thereon, a source/drain metal thin film is deposited, and an NMOS source/drain electrode 16N and a PMOS source/drain electrode 16P are formed by a patterning process, where the NMOS source/drain electrode 16N is connected with the heavily doped area of the NMOS active layer 12N through the via hole, and the PMOS source/drain electrode 16P is connected with the source/drain doped area of the PMOS active layer 12P through the via hole, as shown in FIG. 12. As the source/drain metal thin film, one or more selected from metals of platinum (Pt), ruthenium (Ru), gold (Au), silver (Ag), molybdenum (Mo), chromium (Cr), aluminum (Al), tantalum (Ta), titanium (Ti), tungsten (W), and the like may be used; and silicon nitride (SiNx), silicon oxide (SiOx) or a composite thin film of SiNx/SiOx may be used in depositing the interlayer dielectric layer. Furthermore, when the array substrate of this embodiment is applied in an organic light emitting diode (OLED) display panel, the preparation method may further comprise forming a structural film layer such as an anode, a pixel defining layer and the like.

FIGS. 13 to 20 are schematic diagrams of another embodiment of the preparation method of an array substrate according to the present disclosure. In the aforementioned embodiment, described is a preparation process in which a PMOS active layer doping is first performed, and an NMOS active layer doping is then performed. Different from the aforementioned embodiment, in the preparation process of this embodiment, an NMOS active layer doping is first performed, and a PMOS active layer doping is then performed.

In a first patterning process, a buffer layer and a pattern of NMOS active layer and PMOS active layer are formed on a substrate. The first patterning process in this embodiment is the same as the first patterning process in the above-mentioned embodiment, and will not be reiterated here.

Figure 13:
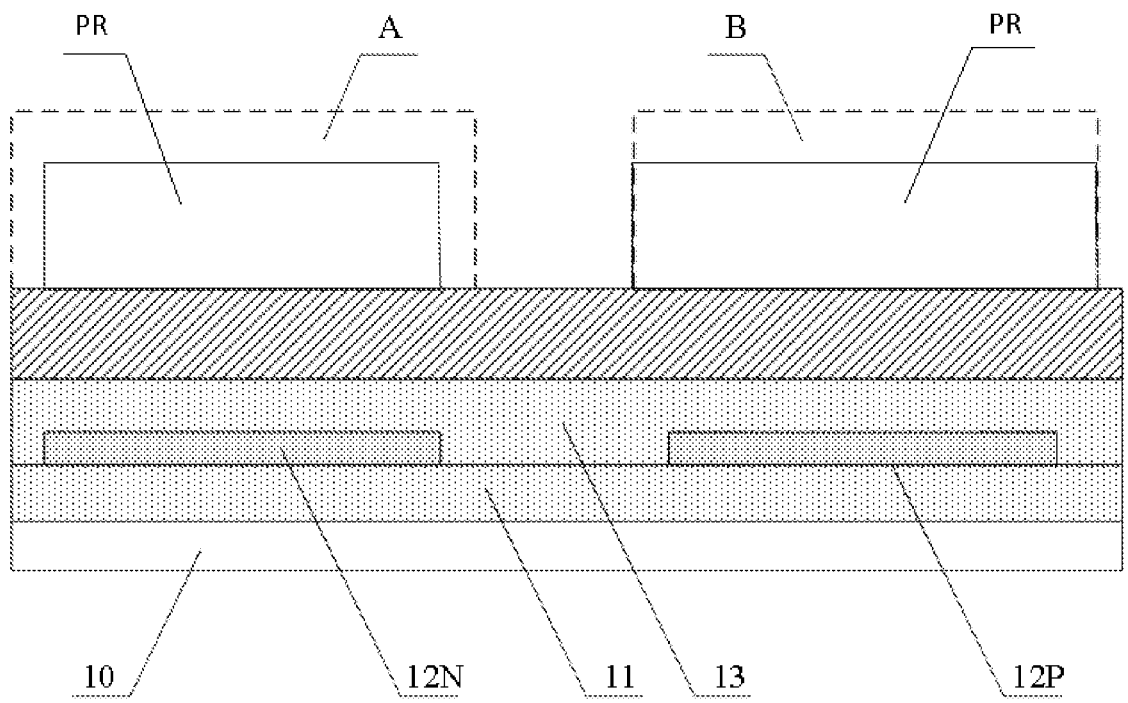
FIG. 13 is a schematic diagram of another embodiment of the present disclosure after forming a patterned photoresist.

In a second patterning process, a PMOS gate electrode, an NMOS gate electrode pattern and doped areas are formed respectively. Forming the PMOS gate electrode, the NMOS gate electrode pattern and the doped areas respectively comprises: (1) Depositing a gate insulating layer 13 and a gate metal layer sequentially on the substrate with the aforementioned pattern formed thereon (after the first patterning process), applying a layer of photoresist (PR) on the gate metal layer, exposing and developing the photoresist with a monochromatic mask, to form an unexposed area with the photoresist retained, including an NMOS patterned photoresist and a PMOS patterned photoresist, and to form a fully exposed area without photoresist at other position, exposing the gate metal layer, as shown in FIG. 13. Here, an orthographic projection of the NMOS patterned photoresist on the substrate 10 is completely overlapped with an orthographic projection of the NMOS active layer 12N on the substrate, and a width of the PMOS patterned photoresist is the same as a width of a PMOS area B, such that an orthographic projection of the PMOS patterned photoresist on the substrate 10 covers an orthographic projection of the PMOS active layer 12P on the substrate 10.

Figure 14:
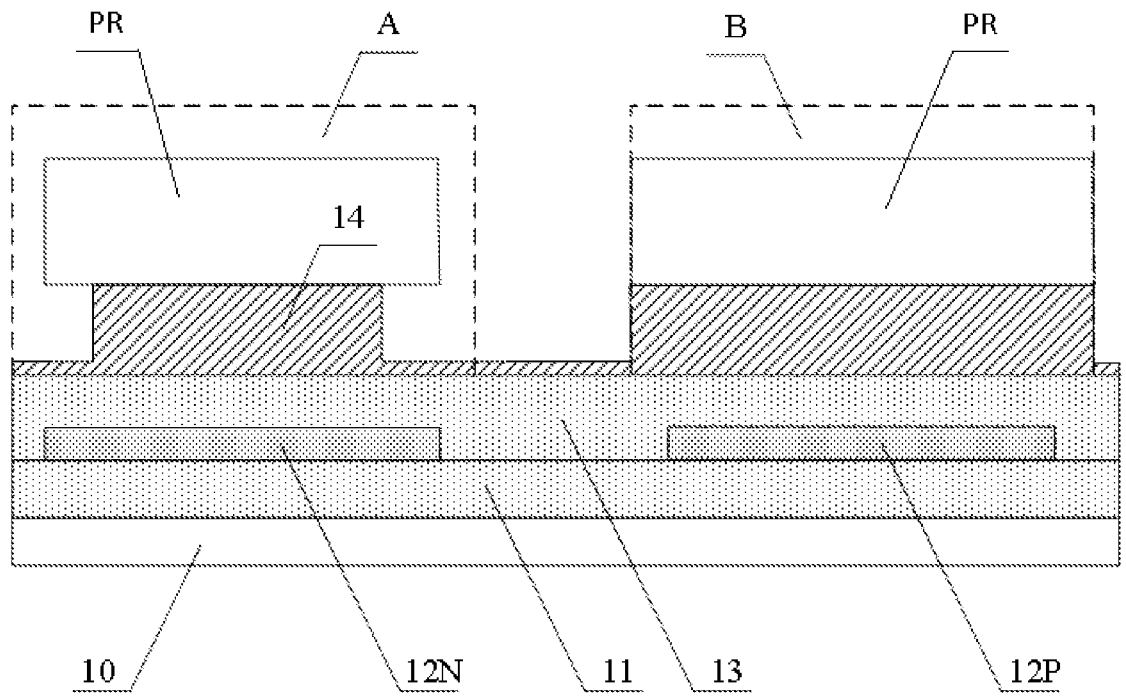
FIG. 14 is a schematic diagram of another embodiment of the present disclosure after wet etching during the formation of an NMOS gate electrode.

(2) Etching the exposed gate metal layer in the fully exposed area by a wet etching process to remove about 80% to 90% of a thickness of the gate metal layer, to form an NMOS gate metal layer 14 pattern above the NMOS active layer 12N, as shown in FIG. 14. Since wet etching does not cause photoresist loss, after the completion of this process, change in the photoresist pattern is relatively small, and two sides of the NMOS gate metal layer 14 are over etched.

Figure 15:
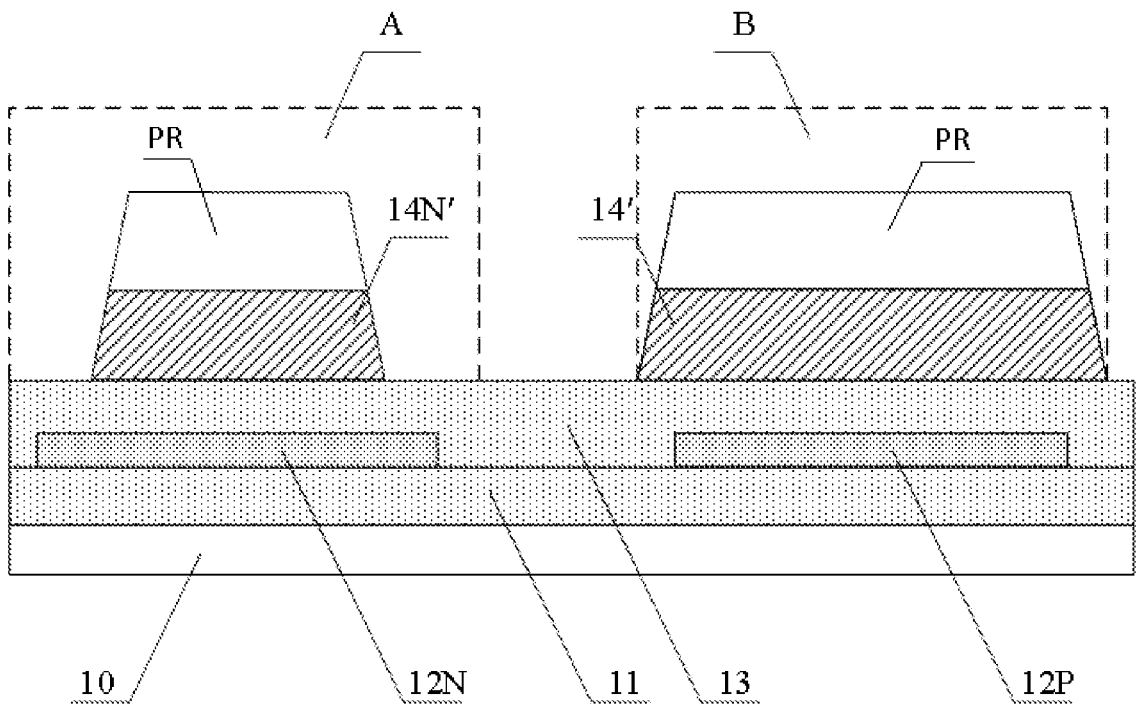
FIG. 15 is a schematic diagram of another embodiment of the present disclosure after dry etching during the formation of the NMOS gate electrode.

(3) Then etching the exposed NMOS gate metal layer 14 in the fully exposed area by a dry etching process, and obtaining an etching endpoint with an electrophoretic display (EPD) technology, to form an NMOS gate electrode transition pattern 14N' and a PMOS gate metal layer 14' pattern, as shown in FIG. 15. Since dry etching causes photoresist loss, the morphology of the photoresist pattern is changed while etching the NMOS gate metal layer 14, and after the completion of etching, the width and thickness of the photoresist pattern are both reduced, such that a width of the NMOS gate electrode transition pattern 14N' is substantially the same as that of the photoresist contact surface.

Figure 16:
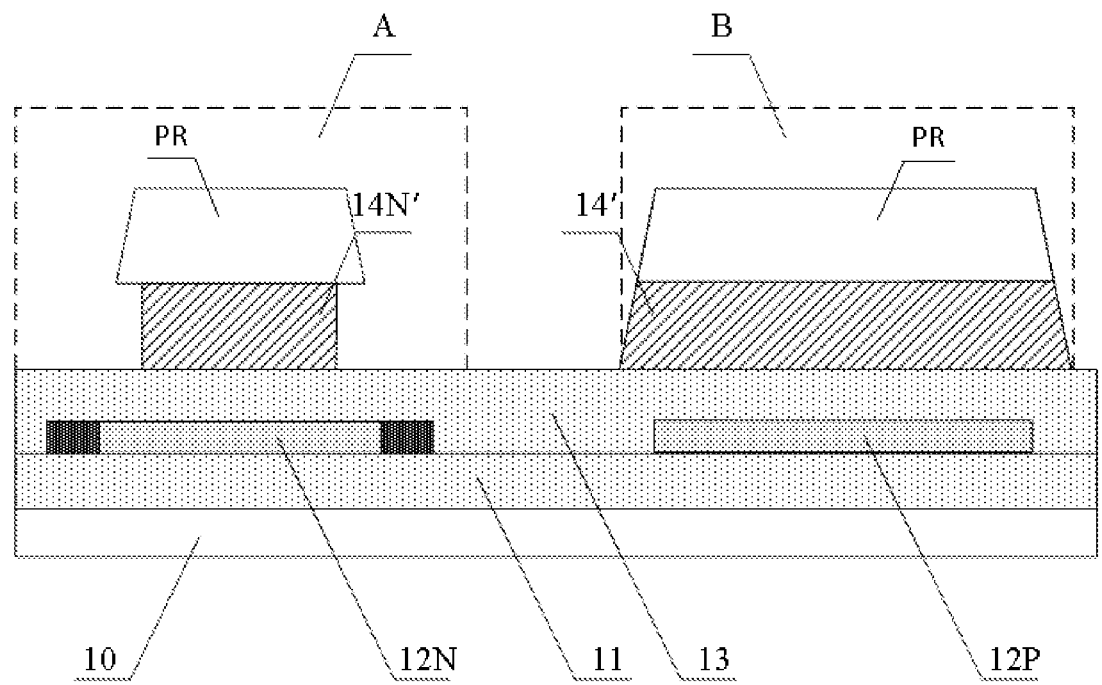
FIG. 16 is a schematic diagram of another embodiment of the present disclosure before lightly doping and after wet etching.

(4) Subsequently, performing a source/drain doping to form a heavily doped area. Actually, because most area of the NMOS active layer 12N is doubly blocked by both the NMOS gate electrode transition pattern 14N' and the photoresist thereon, the influence of doping ions on other area of the NMOS active layer is insulated to the greatest extent, avoiding the doped area deviation and ensuring the length range of the heavily doped area. Subsequently, the NMOS gate electrode transition pattern 14N' is etched by a wet etching process to expose the lightly doped area, as shown in FIG. 16. Generally, a length of the lightly doped area (LLD) is about 1 μm. Using wet etching in this stage can achieve a relatively large etching amount while not causing loss in photoresist.

Figure 17:
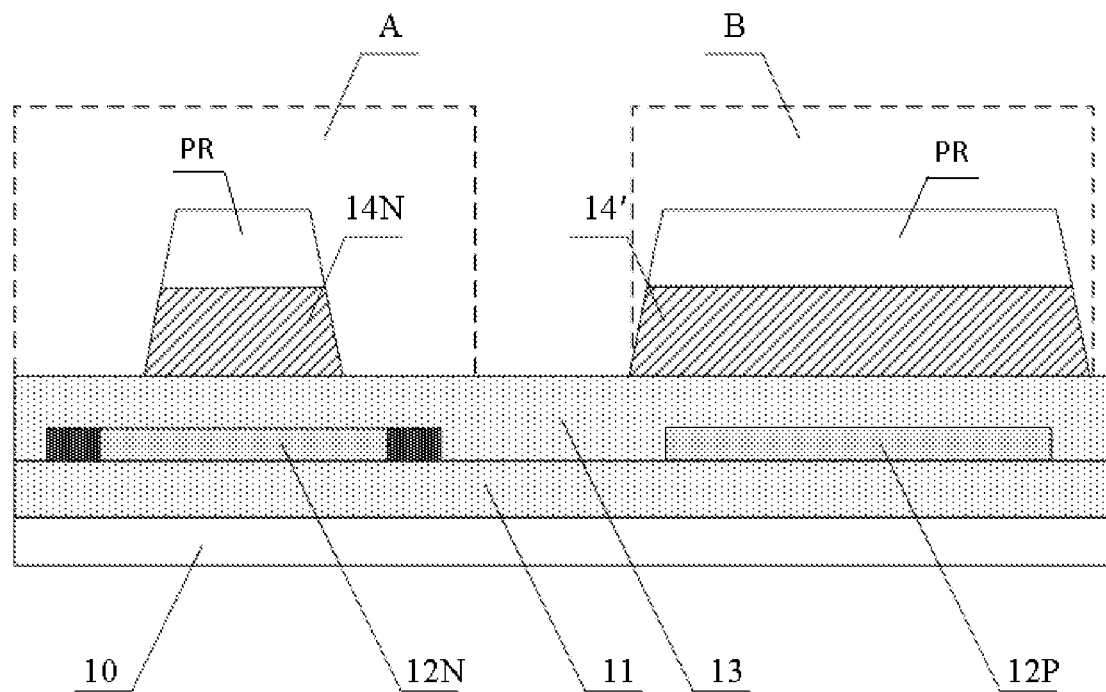
FIG. 17 is a schematic diagram of another embodiment of the present disclosure before lightly doping and after dry etching.

(5) Subsequently, subjecting the photoresist to a dry etching treatment to form an NMOS gate electrode 14N, such that a width of the NMOS gate electrode 14N is substantially equal to that of the photoresist contact surface (taking advantage of the characteristic that a transverse loss rate of the photoresist is larger than a vertical loss rate in dry etching), and a thickness of the photoresist above the NMOS gate electrode 14N is larger than 1 μm, as shown in FIG. 17.

Figure 18:
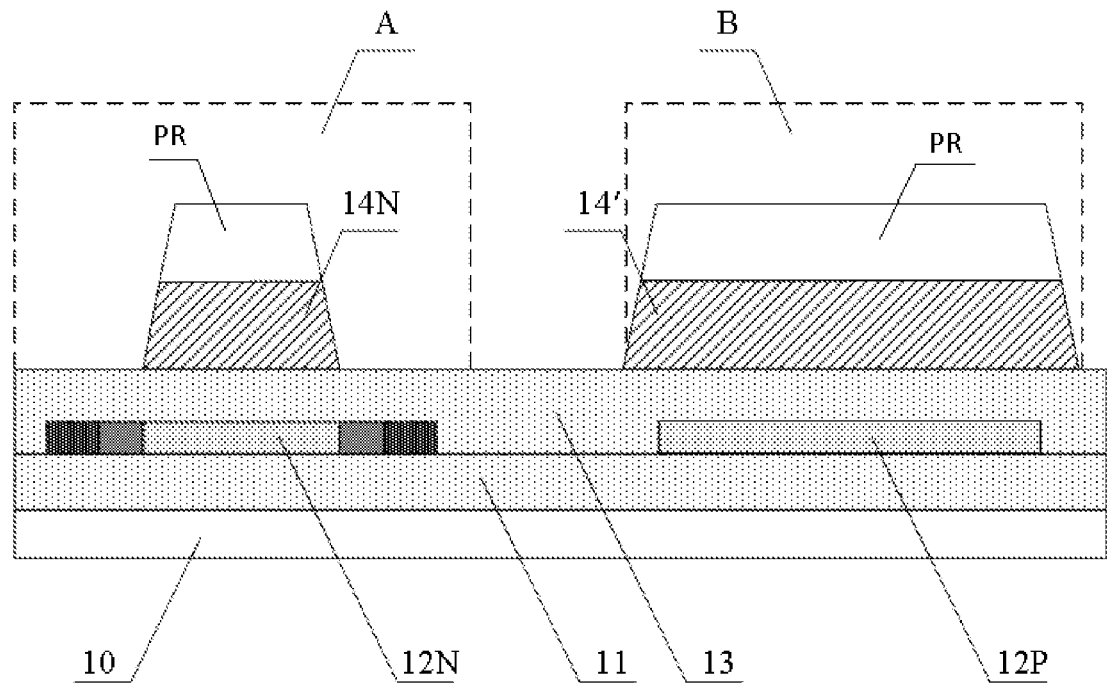
FIG. 18 is a schematic diagram of another embodiment of the present disclosure after forming a lightly doped area.

(6) Subsequently, performing light doping to dope an area of the NMOS active layer 12N not sheltered by the NMOS gate electrode 14N with ions, so as to form a lightly doped area, as shown in FIG. 18. Actually, because most area of the NMOS active layer is doubly blocked by both the NMOS gate metal layer 14 pattern and the photoresist thereon, the influence of doping ions on the channel area of the NMOS active layer is insulated to the greatest extent, avoiding the doped area deviation and ensuring the length range of the lightly doped area.

In the source/drain doping and the light doping of this embodiment, since the PMOS area B is covered with the PMOS gate metal layer 14' and the photoresist thereon, and the photoresist loss is small, the doping treatments do not influence the PMOS active layer.

Figure 19:
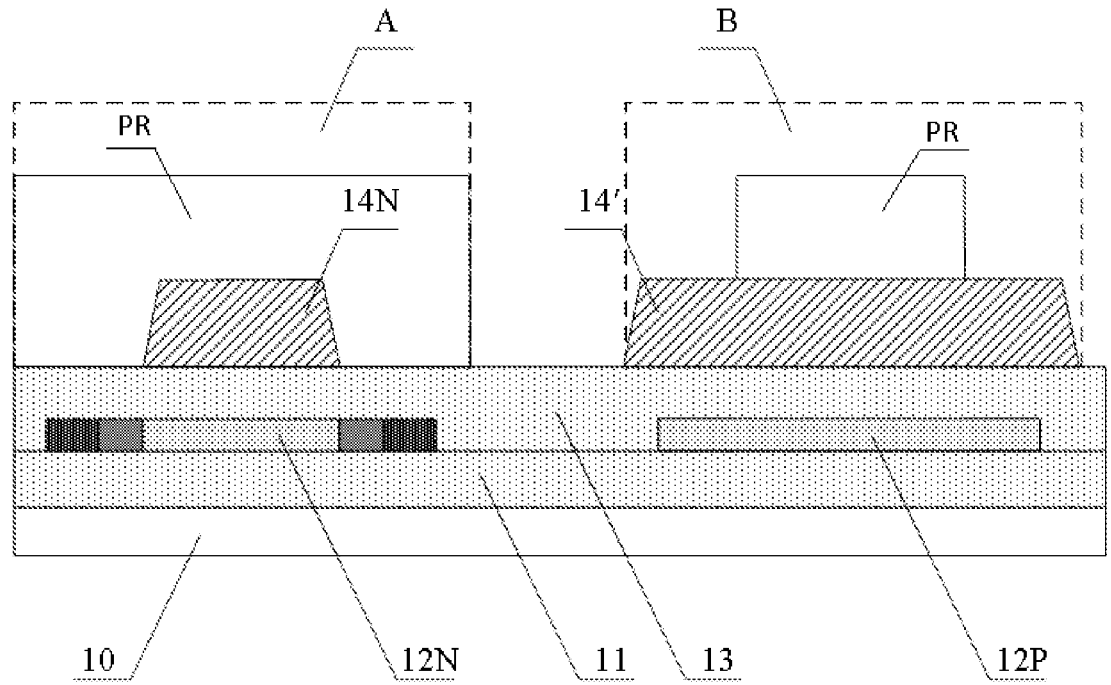
FIG. 19 is a schematic diagram of another embodiment of the present disclosure after forming a patterned photoresist.

(7) Applying a layer of photoresist (PR) on the substrate with the aforementioned pattern formed thereon, exposing and developing the photoresist with a monochromatic mask, to form an unexposed area with the photoresist retained, including an NMOS patterned photoresist and a PMOS patterned photoresist, and to form a fully exposed area without photoresist at other position, exposing the PMOS gate metal layer 14', as shown in FIG. 19. Here, a width of the NMOS patterned photoresist is the same as a width of an NMOS area A, such that the orthographic projection of the NMOS patterned photoresist on the substrate 10 covers the orthographic projection of the NMOS active layer 12N on the substrate 10.

Figure 20:
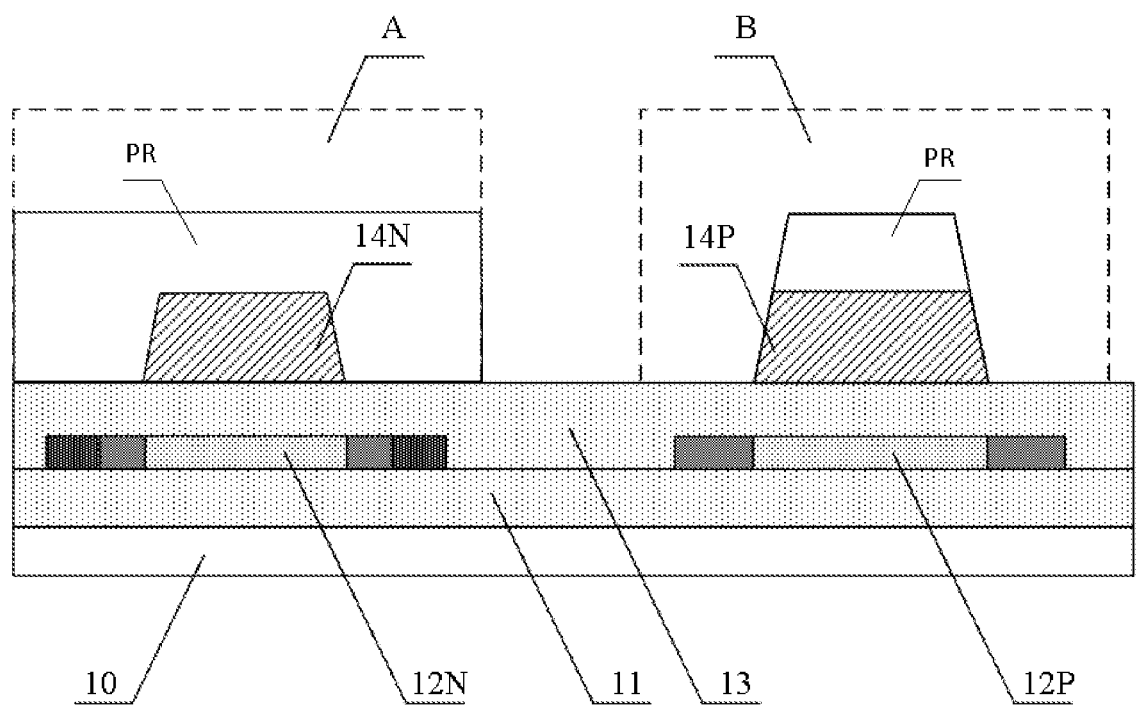
FIG. 20 is a schematic diagram of another embodiment of the present disclosure after forming a PMOS gate electrode and a source/drain doped area.

(8) Etching the PMOS gate metal layer 14' in the fully exposed area to form a PMOS gate electrode 14P pattern. Then, an area of the PMOS active layer 12P not sheltered by the PMOS gate electrode 14P is doped with ions to form a source/drain doped area, as shown in FIG. 20.

In the source/drain doping treatment, since the NMOS area A is covered with the photoresist, the doping does not influence the NMOS active layer.

(9) And finally, stripping the remaining photoresist to form the PMOS gate electrode, the NMOS gate electrode pattern and the doped areas.

In this embodiment, in addition to the technical effects of the aforementioned embodiment, it can further avoid the problem that the PMOS active layer is influenced due to large photoresist loss caused by twice etchings (etching for the NMOS gate electrode transition pattern and etching for the lightly doped area) required in the doping of the NMOS active layer, because the NMOS active layer is first doped and the PMOS active layer is doped later. Because the PMOS active layer is covered with the PMOS gate metal layer 14' and the photoresist thereon having an area equal to that of the PMOS area B when doping the NMOS active layer, the PMOS gate metal layer 14' with a larger area covers the underlying PMOS active layer completely, being capable of functioning as a reliable shelter. When doping the PMOS active layer subsequently, because only once etching is required, it results in smaller photoresist loss than twice etchings, and can be ensured that the photoresist covering the NMOS area A functions as a reliable shelter.

Also, in practical implementation, this embodiment may further comprise forming a structural film layer such as an interlayer dielectric layer, NMOS source/drain electrodes and PMOS source/drain electrodes, an anode, a pixel defining layer, and the like. Since the preparation process is the same as that in the aforementioned embodiment, it will not be reiterated here.

The aforementioned two embodiments take an LTPS CMOS circuit array substrate as example to illustrate the technical solutions of the present disclosure. It can be understood that the present disclosure is also applicable for an LTPS thin film transistor array substrate with only one LTPS active layer. For an LTPS thin film transistor array substrate, the preparation process thereof may comprise: forming a buffer layer on a substrate; forming an active layer on the buffer layer by a patterning process; depositing a gate insulating layer and a gate metal layer sequentially on the substrate with the aforementioned pattern formed thereon; applying a layer of photoresist on the gate metal layer, exposing and developing the photoresist to form a patterned photoresist, an orthographic projection of the patterned photoresist on the substrate covering or being equal to an orthographic projection of the active layer on the substrate; etching the gate metal layer by a wet etching process to remove 80% to 90% of a thickness of the gate metal layer; further etching the gate metal layer by a dry etching process to form a gate electrode transition pattern; doping an area of the active layer not sheltered by the gate electrode transition pattern with ions to form a heavily doped area of the active layer; etching the gate electrode transition pattern by a wet etching process; subjecting the gate electrode transition pattern to a dry etching treatment to form a gate electrode; and doping an area of the active layer not sheltered by the gate electrode with ions to form a lightly doped area.

The technical effects in this embodiment are the same as those in the aforementioned embodiments. In practical implementation, this embodiment may further comprise forming a structural film layer such as an interlayer dielectric layer, source/drain electrodes and the like, which will not be reiterated here.

Further, an extension may be made based on the technical solutions of the aforementioned two embodiments. For example, a combined process of "wet etching+dry etching" may also be used when forming a PMOS gate electrode pattern. Particularly, it comprises: first etching a gate metal layer by a wet etching process to remove 80% to 90% of a thickness of the gate metal layer, then further etching the gate metal layer by a dry etching process, and obtaining an etching endpoint with an electrophoretic display (EPD) technology, to form a PMOS gate electrode pattern. Since the combined process of "wet etching+dry etching" shortens the etching time greatly, damage to the gate insulating layer by dry etching is effectively reduced on the premise of ensuring etching accuracy.

Another extension may also be made on the aforementioned two embodiments with an exception that after forming the heavily doped area, the gate electrode transition pattern is etched only by a dry etching process to form the gate electrode pattern, and subsequently performing light doping immediately. Although photoresist loss is large in dry etching, the active layer channel area is sheltered by the gate electrode pattern, and thus, during light doping, the gate electrode pattern of metal material can insulate the influence of the doping ions on the active layer channel area, and the doped area deviation can be avoided, ensuring the length range of the lightly doped area. Since only dry etching treatment is performed after forming the heavily doped area, this embodiment simplifies the treatment process before light doping.

With respect to an LTPS thin film transistor array substrate, after forming the heavily doped area, it is also possible to etch the gate electrode transition pattern only by a wet etching process to form the gate electrode pattern, followed by stripping the photoresist off and then performing light doping. During light doping, since the active layer channel area is sheltered by the gate electrode pattern, the influence of the doping ions on the active layer channel area can be insulated, and the doped area deviation can be avoided, ensuring the length range of the lightly doped area. Since only wet etching treatment is performed after forming the heavily doped area, and the etching is rapid, this embodiment not only simplifies the treatment process before light doping, but also shortens the process time.

An embodiment of the present disclosure also provides a display device comprising the array substrate according to any of the aforementioned embodiments. The display device may be any product or component having a displaying function such as liquid crystal panel, electronic paper, OLED panel, mobile phone, tablet computer, television, display, notebook, digital photo frame, navigator and the like.

In the description of the embodiments of the present disclosure, it should be understood that direction or position relationship indicated by the term "middle", "above", "below", "front", "back", "vertical", "horizontal", "top", "bottom", "in", "out" or the like is described on the basis of the direction or position relationship shown in figure(s), and it is only for the purpose of describing the present disclosure conveniently and simplifying the description, but it does not indicate or imply that the referred device or member must have a particular direction or position, or be constructed or operated in a particular direction or position. As a result, it should not be interpreted as limiting the present disclosure.

In the description of the embodiments of the present disclosure, it should be noted that, unless specified and defined otherwise, term "installing", "connecting", or "linking" should be broadly interpreted, for example, it can be fixedly connecting, detachably connecting, or integrally connecting; it can be mechanical connection or electric connection; and it can be directly connecting, connecting via an intermediate, or connecting inside two members. Those skilled in the art can understand the particular meanings of the above terms in the present disclosure according to particular circumstances.

Although the embodiments of the present disclosure are illustrated as above, the contents described are only for the convenience of understanding the present invention, but not intended to limit the present invention. One skilled in the art can make any modification or change on the forms and details of the embodiments, without departing from the spirit and scope of the present disclosure. The protection scope of the present invention is defined by the following claims.

What is claimed is:

1. A preparation method of an array substrate, comprising:
    forming an active layer, a gate insulating layer, a gate metal layer and a patterned photoresist sequentially on a substrate;
    forming a gate electrode transition pattern by etching the gate metal layer via a patterned photoresist, using a process consisting of a wet etching process and a dry etching process, said wet etching process and dry etching process being performed in this order;
    wherein said forming the gate electrode transition pattern comprises:
        etching the gate metal layer by using the wet etching process, to form an etched portion of the gate metal layer in which 80% to 90% of a thickness of the gate metal layer is removed, and a non-etched portion of the gate metal layer beneath the photoresist pattern, wherein a width of the photoresist pattern is larger than a width of the non-etched portion of the gate metal layer; and
        further etching the gate metal layer by using the dry etching process, to remove the etched portion of the gate metal layer and a portion of the photoresist pattern beyond the width of non-etched portion of the gate metal layer, thereby forming the gate electrode transition pattern, wherein, a width of the gate electrode transition pattern and a width of the photoresist pattern in a plane of contact surface therebetween are substantially the same; and
    doping an area of the active layer not sheltered by the gate electrode transition pattern with ions to form a heavily doped area of the active layer, by using both the gate electrode transition pattern and the photoresist pattern thereon as a shelter,
    after forming the heavily doped area of the active layer, subjecting the gate electrode transition pattern to a process consisting of a wet etching process and a dry etching process, said wet etching process and dry etching process being performed in this order, to form a gate electrode; and
    after forming the gate electrode, doping an area of the active layer not sheltered by the gate electrode with ions, to form a lightly doped area of the active layer, by using both the gate electrode and the photoresist thereon as a shelter.

2. The preparation method according to claim 1, wherein, said heavily doped area of the active layer is a source/drain doped area of the active layer.

3. The preparation method according to claim 1, wherein, the array substrate is a low temperature poly-silicon thin film transistor array substrate.

4. The preparation method according to claim 3, wherein, said forming the active layer, the gate insulating layer, the gate metal layer and the patterned photoresist sequentially on the substrate comprises:
    forming the active layer on the substrate;
    depositing the gate insulating layer and the gate metal layer sequentially on the substrate with a pattern of the active layer formed thereon; and
    applying a layer of photoresist on the gate metal layer, exposing and developing the photoresist to form the patterned photoresist, an orthographic projection of the patterned photoresist on the substrate covering an orthographic projection of the active layer on the substrate.

5. The preparation method according to claim 1, wherein, the array substrate is a low temperature poly-silicon complementary metal oxide semiconductor (LTPS CMOS) circuit array substrate.

6. The preparation method according to claim 5, wherein, said forming the active layer, the gate insulating layer, the gate metal layer and the patterned photoresist sequentially on the substrate comprises:

forming a negative channel metal oxide semiconductor (NMOS) active layer and a positive channel metal oxide semiconductor (PMOS) active layer on the substrate;

depositing the gate insulating layer and the gate metal layer sequentially on the substrate with a pattern of the NMOS active layer and the PMOS active layer formed thereon; and forming a PMOS gate electrode and a source/drain doped area of the PMOS active layer; and applying a layer of photoresist, exposing and developing the photoresist to form an NMOS patterned photoresist and a PMOS patterned photoresist, orthographic projections of the NMOS patterned photoresist and the PMOS patterned photoresist on the substrate covering orthographic projections of the NMOS active layer and the PMOS active layer on the substrate respectively.

7. The preparation method according to claim 6, wherein, said forming the PMOS gate electrode and the source/drain doped area of the PMOS active layer comprises:

forming the PMOS gate electrode and an NMOS gate metal layer pattern by a patterning process, an orthographic projection of the NMOS gate metal layer pattern on the substrate covering that of the NMOS active layer on the substrate; and doping an area of the PMOS active layer not sheltered by the PMOS gate electrode with ions to form the source/drain doped area of the PMOS active layer.

8. The preparation method according to claim 5, wherein, the LTPS CMOS circuit array substrate comprises an NMOS area and a PMOS area, and said forming the active layer, the gate insulating layer, the gate metal layer and the patterned photoresist sequentially on the substrate comprises:

forming an NMOS active layer and a PMOS active layer on the substrate;

depositing the gate insulating layer and the gate metal layer sequentially on the substrate with a pattern of the NMOS active layer and the PMOS active layer formed thereon; and applying a layer of photoresist on the gate metal layer, exposing and developing the photoresist to form an NMOS patterned photoresist and a PMOS patterned photoresist, an orthographic projection of the NMOS patterned photoresist on the substrate being completely overlapped with an orthographic projection of the NMOS active layer on the substrate, and a width of the PMOS patterned photoresist being the same as a width of the PMOS area, such that an orthographic projection of the PMOS patterned photoresist on the substrate covering an orthographic projection of the PMOS active layer on the substrate.

9. The preparation method according to claim 8, wherein, after forming the gate electrode and the lightly doped area of the active layer in the NMOS area, the preparation method further comprises:

forming a PMOS gate electrode and a source/drain doped area of the PMOS active layer.

10. The preparation method according to claim 9, wherein, said forming the PMOS gate electrode and the source/drain doped area of the PMOS active layer comprises:

applying a layer of photoresist, exposing and developing the photoresist to form an NMOS patterned photoresist and a PMOS patterned photoresist, an orthographic projection of the NMOS patterned photoresist on the substrate covering an orthographic projection of the NMOS active layer on the substrate;

etching the gate metal layer in the PMOS area by a wet etching process, to form an etched portion of the gate metal layer in which 80% to 90% of a thickness of the gate metal layer is removed, and a non-etched portion of the gate metal layer beneath photoresist pattern, wherein a width of the photoresist pattern is larger than a width of the non-etched portion of the gate metal layer;

then etching the gate metal layer by a dry etching process, to remove the etched portion of the gate metal layer and a portion of the photoresist pattern beyond the width of non-etched portion of the gate metal layer, thereby forming the PMOS gate electrode, wherein, a width of the PMOS gate electrode and a width of the photoresist pattern in a plane of contact surface therebetween are substantially the same; and doping an area of the PMOS active layer not sheltered by the PMOS gate electrode with ions to form the source/drain doped area of the PMOS active layer.

11. The preparation method according to claim 1, wherein, after forming the lightly doped area of the active layer, the preparation method further comprises:

stripping the remaining photoresist off;

forming an interlayer dielectric layer; and forming source/drain electrodes on the interlayer dielectric layer, the source/drain electrodes being connected with the heavily doped area of the active layer through via holes.

12. An array substrate prepared by the preparation method according to claim 1.

13. A display device comprising the array substrate according to claim 12.

* * * * *